US007781148B2

(12) United States Patent
Savariar-Hauck et al.

(10) Patent No.: US 7,781,148 B2
(45) Date of Patent: *Aug. 24, 2010

(54) DUAL-LAYER HEAT-SENSITIVE IMAGEABLE ELEMENTS WITH A POLYVINYL ACETAL TOP LAYER

(75) Inventors: Celin Savariar-Hauck, Badenhausen (DE); Gerhard Hauck, Badenhausen (DE); Horst Glatt, Munich (DE); Dietmar Frank, Northeim (DE)

(73) Assignee: Kodak Graphic Communications, GmbH, Osterode (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/997,564

(22) PCT Filed: Aug. 1, 2006

(86) PCT No.: PCT/EP2006/007618

§ 371 (c)(1),
(2), (4) Date: Feb. 1, 2008

(87) PCT Pub. No.: WO2007/017162

PCT Pub. Date: Feb. 15, 2007

(65) Prior Publication Data

US 2008/0206674 A1 Aug. 28, 2008

(30) Foreign Application Priority Data

Aug. 5, 2005 (DE) ........................ 10 2005 037 015
Aug. 5, 2005 (DE) ........................ 10 2005 037 071

(51) Int. Cl.
*G03F 7/26* (2006.01)

(52) U.S. Cl. ................. 430/302; 430/270.1; 430/283.1; 430/282.1

(58) Field of Classification Search ................. 430/302
See application file for complete search history.

(56) References Cited

U.S. PATENT DOCUMENTS

| | | | | |
|---|---|---|---|---|
| 6,358,669 | B1 * | 3/2002 | Savariar-Hauck et al. | 430/273.1 |
| 7,279,263 | B2 * | 10/2007 | Goodin | 430/157 |
| 2003/0129532 | A1 | 7/2003 | Kawauchi et al. | |
| 2004/0180285 | A1 * | 9/2004 | Tao et al. | 430/270.1 |
| 2007/0269727 | A1 * | 11/2007 | Savariar-Hauck et al. | 430/66 |

FOREIGN PATENT DOCUMENTS

| | | |
|---|---|---|
| EP | 1437232 | 9/2004 |
| EP | 1506856 | 2/2005 |
| EP | 2005/039878 | 6/2005 |
| WO | WO 2005039878 A1 * | 5/2005 |

* cited by examiner

*Primary Examiner*—Cynthia H Kelly
*Assistant Examiner*—Chanceity N Robinson
(74) *Attorney, Agent, or Firm*—J. Lanny Tucker

(57) ABSTRACT

Thermally imagable elements are described comprising on a substrate with hydrophilic surface (a) a first layer comprising a first polymer soluble or swellable in aqueous alkaline developer and insoluble in organic solvents with low polarity and (b) a second layer comprising a second polymer soluble or swellable in aqueous alkaline developer, wherein the first polymer is different from the second polymer and the second polymer comprises vinyl acetal repeating units and pendant acidic groups selected from COOH, —$SO_3H$, —$PO_3H_2$, —$PO_4H_2$, aromatic OH and groups having acidic amide or imide groups.

22 Claims, No Drawings

DUAL-LAYER HEAT-SENSITIVE IMAGEABLE ELEMENTS WITH A POLYVINYL ACETAL TOP LAYER

The present invention relates to heat-sensitive positive working elements, in particular heat-sensitive printing plate precursors comprising two layers on the substrate wherein the top layer comprises a polyvinyl acetal. The invention furthermore relates to a process for the production of such elements and a process for imaging such elements.

Lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor (the term printing plate precursor refers to a coated printing plate prior to exposure and developing) comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure.

In conventional plates, a film containing the information to be transferred is attached to the printing plate precursor under vacuum in order to guarantee good contact. The plate is then exposed by means of a radiation source, part of which is comprised of UV radiation. When a positive plate is used, the area on the film corresponding to the image on the plate is so opaque that the light does not affect the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

For several decades, positive working commercial printing plate precursors were characterized by the use of alkali-soluble phenolic resins and naphthoquinone diazide derivatives; imaging was carried out by means of UV radiation.

Recent developments in the field of lithographic printing plate precursors have led to radiation-sensitive compositions suitable for the production of printing plate precursors which can be addressed directly by lasers. The digital image-forming information can be used to convey an image onto a printing plate precursor without the use of a film, as is common in conventional plates.

One example of a positive working, direct laser addressable printing plate precursor is described in U.S. Pat. No. 4,708,925. The patent describes a lithographic printing plate precursor whose imaging layer comprises a phenolic resin and a radiation-sensitive onium salt. As described in the patent, the interaction between the phenolic resin and the onium salt results in an alkali solvent resistance of the composition, which restores the alkali solubility by photolytic decomposition of the onium salt. The printing plate precursor can be used as a precursor of a positive working printing plate or as a precursor of a negative printing plate, if additional process steps are added between exposure and developing, as described in detail in British patent no. 2,082,339. The printing plate precursors described in U.S. Pat. No. 4,708,925 are UV-sensitive per se and can additionally be sensitized to visible and IR radiation.

Another example of a direct laser addressable printing plate precursor that can be used as a positive working system is described in U.S. Pat. No. 5,372,907 and U.S. Pat. No. 5,491,046. These two patents describe the decomposition of a latent Bronsted acid by radiation in order to increase solubility of the resin matrix upon image-wise exposure. As in the case of the printing plate precursor described in U.S. Pat. No. 4,708,925, these systems can also be used as negative working systems in combination with additional process steps between imaging and developing. In the case of the negative working printing plate precursors, the decomposition by-products are subsequently used to catalyze a crosslinking reaction between the resins in order to render the layer of the irradiated areas insoluble, which requires a heating step prior to developing. As in U.S. Pat. No. 4,708,925, these printing plate precursors are UV-sensitive per se due to the used acid-forming materials.

U.S. Pat. No. 6,294,311 B1, U.S. Pat. No. 6,358,669 B1 and U.S. Pat. No. 6,555,291 B1 each describe heat-sensitive dual-layer lithographic printing plate precursors. These precursors exhibit excellent sensitivity. It would, however, be desirable to obtain precursors having an improved resistance to organic solvents with which they come into contact (e.g. ingredients in developers, fountain solutions and blanket washing solutions).

Other heat-sensitive dual-layer printing plate precursors are for example described in U.S. Pat. No. 6,352,812 B1, U.S. Pat. No. 6,699,636 and U.S. Pat. No. 6,352,811 B1; however, it would be desirable to further improve their resistance to chemicals and/or their abrasion resistance.

EP 1 433 594 A2 discloses a heat-sensitive printing plate precursor with two imaging layers wherein the top layer comprises a copolymer comprising the following unit:

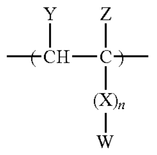

wherein W is a carboxy group and the divalent group X is preferably a single bond, an alkylene group or an arylene group which can comprise an ether (—O—), thioether (—S—), ester (—COO—) or amide (—CONR—) bond. However, the sensitivity of these printing plate precursors is insufficient for sophisticated applications; moreover, the exposure range is very narrow.

It is the object of the present invention to provide a positive working thermally imagable element like a lithographic printing plate precursor characterized by a high degree of resistance to organic solvents; at the same time, the element should exhibit excellent abrasion resistance and sensitivity.

This object is surprisingly achieved by an imagable element comprising in order:

(a) a substrate with a hydrophilic surface;

(b) a first layer comprising a first polymer soluble or swellable in aqueous alkaline developer and insoluble in organic solvents of low polarity; and (c) a second layer comprising a second polymer soluble or swellable in aqueous alkaline developers, wherein the first polymer is different from the second polymer, wherein the second polymer comprises vinyl acetal repeating units and pendant acidic groups selected from COOH, $—SO_3H$, $—PO_3H_2$, $—PO_4H_2$, aromatic OH, and groups having acidic amide or imide groups, wherein the element optionally comprises a photothermal conversion material, and wherein the second layer accepts ink and is insoluble/impenetrable in/by an aqueous alkaline developer but is rendered soluble in or penetrable by the developer by IR radiation.

As used in the present invention, the term "(meth)acrylate" encompasses both "acrylate" and "methacrylate"; analogously, the same applies to the term "(meth)acrylic acid".

For the purpose of the present invention, a polymer such as e.g. a novolak is considered soluble in an aqueous alkaline developer (with a pH of about 8 to 14) if 1 g or more dissolve in 100 ml of developer at room temperature within a time conventionally used for developing exposed lithographic printing plate precursors.

Unless defined otherwise, the term "alkyl group" as used in the present invention refers to a straight-chain, branched or cyclic saturated hydrocarbon group which preferably comprises 1 to 18 carbon atoms, more preferred 1 to 10 carbon atoms and most preferred 1 to 6 carbon atoms. The alkyl group can optionally comprise one or more substituents (preferably 0 or 1 substituent), for example selected from halogen atoms (fluorine, chlorine, bromine, iodine), CN, $NO_2$, $NR^7_2$, $C(O)OR^7$ and $OR^7$ ($R^7$ independently represents a hydrogen atom, an alkyl group or aryl group). The above definition also applies to the alkyl unit of an aralkyl group and an alkoxy group. The definition also applies to alkenyl groups, except that they comprise a C═C double bond in the hydrocarbon group.

Unless defined otherwise, the term "aryl group" as used in the present invention refers to an aromatic carbocyclic group with one or more fused rings, which preferably comprises 5 to 14 carbon atoms. The aryl group can optionally comprise one or more substituents (preferably 0 to 3) selected for example from halogen atoms, alkyl groups, alkoxy groups, CN, $NO_2$, $NR^7_2$, $COOR^7$ and $OR^7$ (wherein each $R^7$ is independently selected from hydrogen, alkyl and aryl). The above definition also applies to an arylene group and the aryl unit of an aralkyl group. Preferred examples include a phenyl group and a naphthyl group which can optionally be substituted (e.g. a tolyl group). In a heteroaryl group at least one ring carbon atom is replaced with a heteroatom selected from O, S and N; substituents include the ones described above.

A fused ring or ring system as referred to in the present invention is a ring that shares two atoms with the ring to which it is fused.

Unless defined otherwise, the term "carbocyclic" group as used in the present invention refers to a saturated, unsaturated (non-aromatic) or aromatic group which only comprises C atoms as ring atoms.

Unless defined otherwise, the term "heterocyclic group" as used in the present invention refers to a 5- to 7-membered (preferably 5- or 6-membered) saturated, unsaturated (non-aromatic) or aromatic ring, wherein one or more ring carbon atoms are replaced with heteroatoms selected from N, $NR^8$, S and O (preferably N or $NR^8$).

A heterocyclic or carbocyclic group can optionally comprise one or more substituents, selected for example from alkyl groups, aryl groups, aralkyl groups, halogen atoms, $—OR^8$, $—NR^8_2$, $—C(O)OR^8$, $C(O)NR^8_2$ and CN (wherein each $R^8$ is independently selected from hydrogen, alkyl, aryl and aralkyl).

Substrate

The imagable elements of the present invention comprise a substrate with hydrophilic surface. The substrate used for the elements of the present invention is preferably a dimensionally stable plate or foil-shaped material that has already been used as a substrate for printing forms is preferably used as a substrate. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetatebutyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition. Among these substrates, an aluminum plate or foil is especially preferred since it shows a remarkable degree of dimensional stability, is inexpensive, thermally stable and furthermore exhibits excellent adhesion to the coating. Furthermore, a composite film can be used wherein an aluminum foil has been laminated onto a polyethylene terephthalate film.

The surface of the substrate either is hydrophilic as such or has been subjected to a suitable and well-known treatment for providing the surface with hydrophilic properties.

A metal substrate, in particular an aluminum substrate, is preferably subjected to a surface treatment, for example graining by brushing in a dry state or brushing with abrasive suspensions, or electrochemical graining, e.g. by means of a hydrochloric acid electrolyte, and optionally anodizing.

Furthermore, in order to improve the hydrophilic properties of the surface of the metal substrate that has been grained and optionally anodized in sulfuric acid or phosphoric acid, the metal substrate can be subjected to an aftertreatment with an aqueous solution of e.g. sodium silicate, calcium zirconium fluoride, polyvinylphosphonic acid or phosphoric acid; a solution containing a phosphate and an alkali fluoride (like sodium fluoride) can also be used for the hydrophilizing aftertreatment. Within the framework of the present invention, the term "substrate" also encompasses an optionally pre-treated substrate exhibiting, for example, a hydrophilizing layer (also known as "interlayer") on its surface.

The details of the above-mentioned substrate pre-treatment are well known to the person skilled in the art.

First Layer

The first layer comprises at least one first polymer which is soluble or swellable in aqueous alkaline developers and insoluble in organic solvents of low polarity.

Solvents of low polarity wherein the first polymer is insoluble include for example butyl acetate, ethyl acetate, methyl isobutyl ketone, propylene glycol monomethylether acetate and propylene glycol monoethylether acetate.

Examples of the first polymer include acrylic polymers and copolymers with carboxyl functions, copolymers of vinyl acetate, crotonate and vinyl neodecanoate, copolymers of styrene and maleic acid anhydride, wood rosin esterified with maleic acid, and combinations thereof.

Particularly suitable polymers are derived from N-substituted maleimides, in particular N-phenylmaleimide, (meth) acrylamides, in particular methacrylamide, and acrylic acid and/or methacrylic acid, in particular methacrylic acid. Copolymers of two of these monomers are more preferred, and it is particularly preferred that all three monomers be present in polymerized form. Preferred polymers of that type are copolymers of N-phenylmaleimide, (meth)acrylamide and (meth)acrylic acid, more preferred those comprising 25 to 75 mole % (more preferred 35 to 60 mole %) N-phenylmaleimide, 10 to 50 mole % (more preferred 15 to 40 mole %) (meth)acrylamide and 5 to 30 mole % (more preferred 10 to 30 mole %) (meth)acrylic acid. Other hydrophilic monomers, such as hydroxyethyl(meth)acrylate, can be used instead of a portion of the (meth)acrylamide. Other monomers soluble in aqueous alkaline media can be used instead of (meth)acrylic acid. Such polymers are for example described in DE 199 36 331 A1.

Another group of polymers suitable as first polymer include copolymers comprising the following monomers in polymerized form: 5 to 30 mole % methacrylic acid, 20 to 75 mole % N-phenylmaleimide, N-cyclohexylmaleimide, N-benzylmaleimide or a mixture thereof and 3 to 50 mole % $CH_2C(R)C(O)NHCH_2OR'$ (wherein R is $C_1$-$C_{12}$ alkyl, phenyl, substituted phenyl, aralkyl or $Si(CH_3)_3$ and R' represents H or $CH_3$). Such copolymers are described in detail for example in WO 2005/018934.

Another group of preferred first polymers for the first layer include copolymers comprising a monomer in polymerized form which contains a urea group in its side chain; such copolymers are for example described in U.S. Pat. No. 5,731,127 B. These copolymers comprise 10 to 80 wt % (preferably 20 to 80 wt %) of at least one monomer of the following formula (I):

$$CH_2{=}CR{-}CO_2{-}X{-}NH{-}CO{-}NH{-}Y{-}Z \qquad (I)$$

wherein

R is a hydrogen atom or a methyl group,

X is a divalent linking group,

Y is a divalent substituted or unsubstituted aromatic group, and

Z is selected from OH, COOH and $SO_2NH_2$.

R is preferably a methyl group.

X is preferably a substituted or unsubstituted alkylene group, a substituted or unsubstituted phenylene group ($C_6H_4$) or a substituted or unsubstituted naphthalene group ($C_{10}H_6$), such as $-CH_2)_n-$ (wherein n is an integer from 2 to 8), 1,2-, 1,3- and 1,4-phenylene and 1,4-, 2,7- and 1,8-naphthylene. More preferred, X is an unsubstituted alkylene group $-(CH_2)_n-$ wherein n=2 or 3, and most preferred, X represents $-(CH_2CH_2)-$.

Y is preferably a substituted or unsubstituted phenylene group or a substituted or unsubstituted naphthylene group. More preferred, Y is an unsubstituted 1,4-phenylene group.

Z is preferably OH.

A preferred monomer is $$CH_2{=}C(CH_3){-}CO_2{-}CH_2CH_2{-}NH{-}CO{-}NH\text{-}(p\text{-}C_6H_4){-}Z \qquad (Ia),$$

wherein Z is selected from OH, COOH and $SO_2NH_2$, and is preferably OH.

Monomers comprising one or more urea groups can be used in the synthesis of said copolymers. In polymerized form, the copolymers furthermore comprise 20 to 90 wt % of other polymerizable monomers such as maleimide, acrylic acid, methacrylic acid, acrylic acid esters, methacrylic acid esters, acrylonitrile, methacrylonitrile, acrylamides and methacrylamides. Preferably, the copolymers soluble in alkaline solutions comprise 30 to 70 wt % of the monomer with urea groups, 20 to 60 wt % acrylonitrile or methacrylonitrile (preferably acrylonitrile) and 5 to 25 wt % acrylamide or methacrylamide (preferably methacrylamide).

The polymers described above are soluble in aqueous alkaline developers; they are furthermore soluble in polar solvents such as ethylene glycol monomethylether, which can be used as coating solvent for the production of the first layer, or mixtures of methyl lactate, methanol and dioxolane. The polymers described above can be prepared using known methods of free-radical polymerization.

Derivatives of methylvinylether/maleic acid anhydride copolymers comprising an N-substituted cyclic imide unit and derivatives of styrene/maleic acid anhydride copolymers comprising an N-substituted cyclic imide unit can also be used as first polymer in the first coating solution if they are soluble in aqueous alkaline media. Such copolymers can for example be prepared by reacting maleic acid anhydride copolymer and an amine such as p-aminobenzene sulfonamide or p-aminophenol and subsequent cyclization by means of an acid.

Another group of polymers that can be used as first polymer are copolymers containing 1 to 90 mole % of a sulfonamide monomer unit, in particular N-(p-aminosulfonylphenyl)-methacrylamide, N-(m-aminosulfonylphenol) methacrylamide, N-(o-aminosulfonylphenyl)-methacrylamide and/or corresponding acrylamides. Suitable polymers containing a sulfonamide group in their side chain, processes for their production and suitable monomers are described in U.S. Pat. No. 5,141,838 B. Especially suitable polymers comprise (1) a sulfonamide monomer unit, in particular N-(p-aminosulfonylphenyl)methacrylamide, (2) acrylonitrile and/or methacrylonitrile and (3) methylmethacrylate and/or methylacrylate. Some of these copolymers are available from Kokusan Chemical, Gumma, Japan under the tradename PU Copolymers.

Furthermore, polyacrylates can be used as first polymer which contain structural units of the following formulas (IIa) and/or (IIb):

$$-[CH_2{-}CH(CO{-}X^1{-}R^1{-}SO_2NH{-}R^2)]- \qquad (IIa)$$

$$-[CH_2{-}CH(CO{-}X^1{-}R^1{-}NHSO_2{-}R^{2a})]- \qquad (IIb)$$

wherein $X^1$ independently represents O or $NR^3$;

$R^1$ independently represents a substituted or unsubstituted alkylene group (preferably $C_1$-$C_{12}$), cycloalkylene group (preferably $C_6$-$C_{12}$), arylene group (preferably $C_6$-$C_{12}$) or aralkylene group (preferably $C_7$-$C_{14}$);

$R^2$ and $R^3$ each independently represent a hydrogen atom or a substituted or unsubstituted alkyl group (preferably $C_1$-$C_{12}$); cycloalkyl group (preferably $C_6$-$C_{12}$), aryl group (preferably $C_6$-$C_{12}$) or aralkyl group (preferably $C_7$-$C_{14}$); and $R^{2a}$ represents a substituted or unsubstituted alkyl group (preferably $C_1$-$C_{12}$), cycloalkyl group (preferably $C_6$-$C_{12}$), aryl group (preferably $C_6$-$C_{12}$) or aralkyl group (preferably $C_7$-$C_{14}$).

Such polyacrylates and starting monomers and comonomers for their production are described in detail in EP-A-0 544 264 (pages 3 to 5).

According to the present invention, polymethacrylates analogous to the polyacrylates of formulas (IIa) and (IIb) can be used as well in the first layer.

Polyacrylates with sulfonamide side groups which additionally contain a urea group in the side chains can also be used as first polymer. Such polyacrylates are for example described in EP-A-0 737 896 and comprise the following structural unit (IIc):

(IIc)

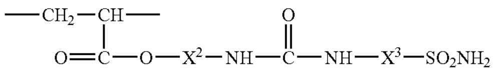

wherein $X^2$ is a substituted or unsubstituted alkylene group (preferably $C_1$-$C_{12}$), cycloalkylene group (preferably $C_6$-$C_{12}$), arylene group (preferably $C_6$-$C_{12}$) or aralkylene group (preferably $C_7$-$C_{14}$), and $X^3$ is a substituted or unsubstituted arylene group (preferably $C_6$-$C_{12}$).

According to the present invention, polymethacrylates analogous to the polyacrylates of formula (IIc) can be used as well in the first layer.

The polyacrylates of formulas (IId) with urea groups and phenolic OH mentioned in EP-A-0 737 896 can also be used as first polymer:

(IId)

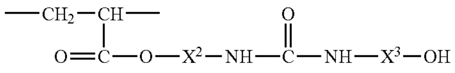

wherein $X^2$ and $X^3$ are as defined above.

According to the present invention, polymethacrylates analogous to the polyacrylates of formula (IId) can be used as well in the first layer.

The weight average of the molecular weight of suitable poly(meth)acrylates with sulfonamide side groups and/or phenolic side groups is preferably 2,000 to 300,000.

Of course, mixtures of different first polymers soluble in alkaline developers and preferably insoluble in organic solvents of low polarity can be used as well.

Based on the dry layer weight of the first layer, the first polymer is present in an amount of at least 50 wt %, preferably at least 60 wt %, more preferred at least 70 wt % and particularly preferred at least 80 wt %. In the first embodiment described above, preferably the amount does not exceed 99.9 wt %, more preferred 95 wt %, still more preferred 85 wt %. In the second embodiment described above, the first layer may consist exclusively of the first polymer.

If the element is to be imaged by exposure to IR radiation it comprises a photothermal conversion material which can be present in the first or second layer or both or in a separate absorber layer present between the first and second layer. If direct application of heat is to be used instead of IR radiation it is not necessary that a photothermal conversion material is present.

According to one embodiment of the present invention, the first layer comprises at least one photothermal conversion material (in the following also referred to as "IR absorber").

The photothermal conversion material is capable of absorbing IR radiation and converting it into heat. The chemical structure of the IR absorber is not particularly restricted, as long as it is capable of converting the radiation it absorbed into heat. It is preferred that the IR absorber show essential absorption in the range of 650 to 1,300 μm, preferably 750 to 1,120 nm, and it preferably shows an absorption maximum in that range. IR absorbers showing an absorption maximum in the range of 800 to 1,100 nm are especially preferred. It is furthermore preferred that the IR absorber not or not essentially absorb radiation in the UV range. The absorbers are for example selected from carbon black, phthalocyanine pigments/dyes and pigments/dyes of the polythiophene, squarylium, thiazolium, croconate, merocyanine, cyanine, indolizine, pyrylium or metaldithiolin classes, especially preferred from the cyanine class. Suitable IR absorbers include for example the compounds listed in Table 1 of U.S. Pat. No. 6,326,122. Additional examples can be found in U.S. Pat. No. 4,327,169, U.S. Pat. No. 4,756,993, U.S. Pat. No. 5,156,938, WO 00/29214, U.S. Pat. No. 6,410,207 and EP-A-1 176 007.

Suitable IR absorbers are for instance cyanine dyes of formula (III)

(III)

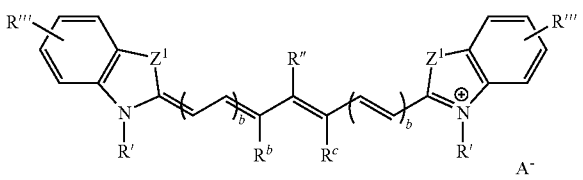

wherein each $Z^1$ independently represents S, O, $NR^a$ or $C(alkyl)_2$;

each R' independently represents an alkyl group, an alkylsulfonate group or an alkylammonium group;

R" represents a halogen atom, $SR^a$, $OR^a$, $SO_2R^a$ or $NR^a{}_2$ (preferably a halogen atom, $SR^a$ or $NR^a{}_2$);

each R'" independently represents a hydrogen atom, an alkyl group, —$COOR^a$, —$OR^a$, —$SR^a$, —$NR^a{}_2$ or a halogen atom; R'" can also be a benzofused ring;

$A^-$ represents an anion;

$R^b$ and $R^c$ either both represent hydrogen atoms or, together with the carbon atoms to which they are bonded, form a carbocyclic five- or six-membered ring;

$R^a$ represents a hydrogen atom, an alkyl or aryl group (in $SR^aR^a$ is preferably an aryl with S being a member of the aryl ring, in $NR^a{}_2$ each $R^a$ is preferably an aryl group);

each b can independently be 0, 1, 2 or 3.

If R' represents an alkylsulfonate group, an internal salt can form so that no anion $A^-$ is necessary. If R' represents an alkylammonium group, a second counterion is needed which is the same as or different from $A^-$.

$Z^1$ is preferably a $C(alkyl)_2$ group.

R' is preferably an alkyl group with 1 to 4 carbon atoms.

R" is preferably a halogen atom or $SR^a$.

R"' is preferably a hydrogen atom.

$R^a$ is preferably an optionally substituted phenyl group or an optionally substituted heteroaromatic group.

Preferably, $R^b$ and $R^c$, together with the carbon atoms to which they are bonded, form a 5- or 6-membered carbocyclic ring.

The counterion $A^-$ is preferably a chloride ion, trifluoromethylsulfonate or a tosylate anion.

Of the IR dyes of formula (II), dyes with a symmetrical structure are especially preferred. Examples of especially preferred dyes include:

2-[2-[2-Phenylsulfonyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclohexene-1-yl]-ethenyl]-1,3,3-trimethyl-3H-indoliumchloride, 2-[2-[2-thiophenyl-3-[2-(1,3-dihydro-1,3,3-trimethyl-2H-indole-2-ylidene)-ethylidene]-1-cyclopentene-1-yl]-ethenyl]-1,3,3-trimethyl-3H-indoliumtosylate, 5-chloro-2-(2-{3-[2-(5-chloro-1-ethyl-3,3-dimethyl-1,3-dihydro-indole-2-ylidene)-ethylidene]-2-diphenylamino-cyclopent-1-enyl}-vinyl)-1-ethyl-3,3-dimethyl-3H-indolium salt (e.g. tetrafluoroborat), 2-[2-[2-chloro-3-[2-(1,3-dihydro-1,3,3-trimethyl-2H-benzo[e]-indole-2-ylidene)-ethylidene]-1-cyclohexene-1-yl]-ethenyl]-1,3,3-trimethyl-1H-benzo[e]-indolium-tosylate and 2-[2-[2-chloro-3-[2-ethyl-(3H-benzthiazole-2-ylidene)-ethylidene]-1-cyclohexene-1-yl]-ethenyl]-3-ethyl-benzthiazolium-tosylate.

The following compounds are also IR absorbers suitable for use in the present invention:

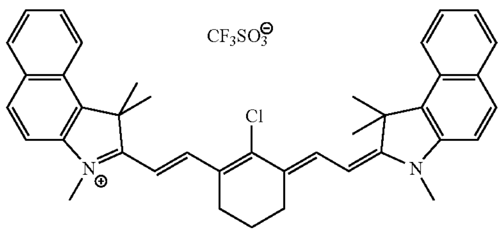

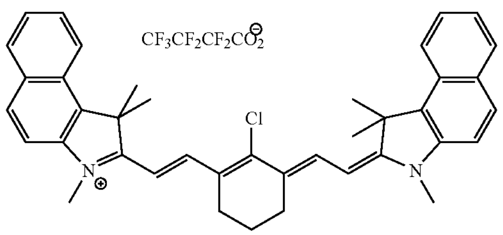

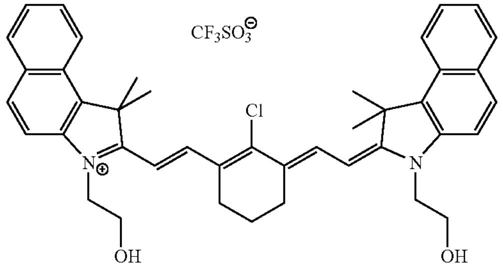

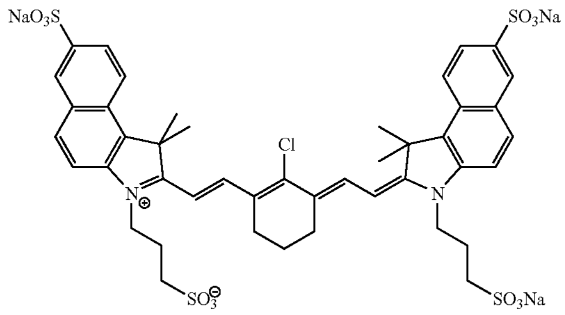

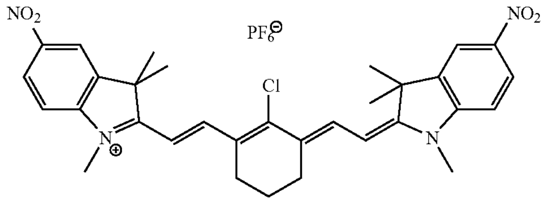

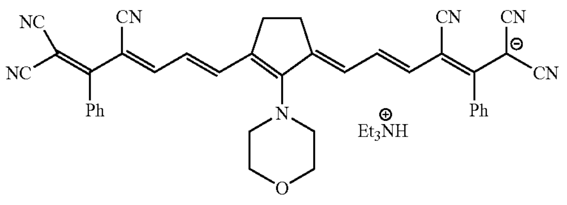

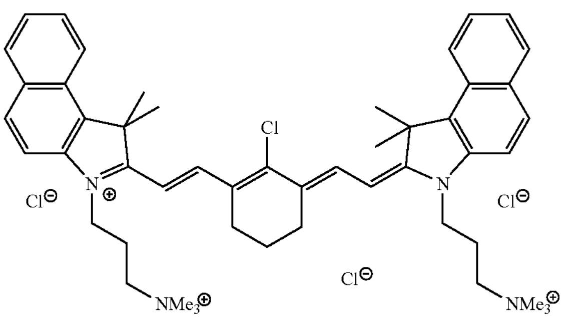

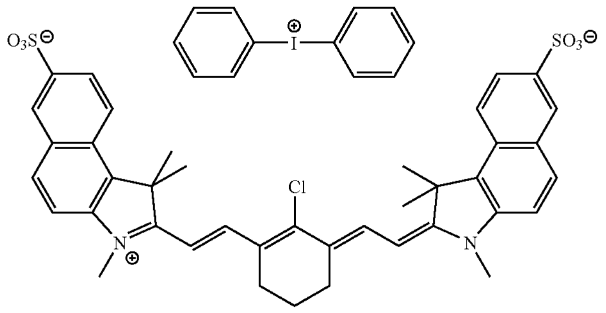

-continued
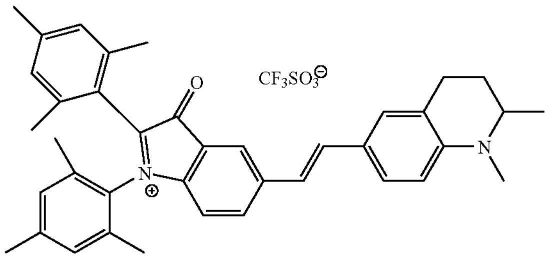
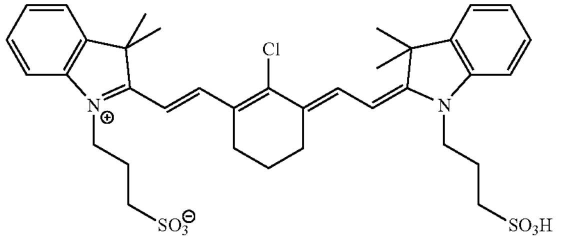
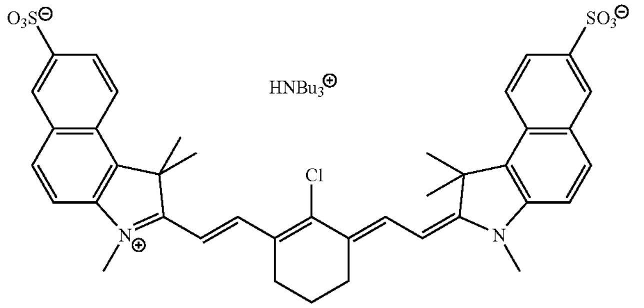
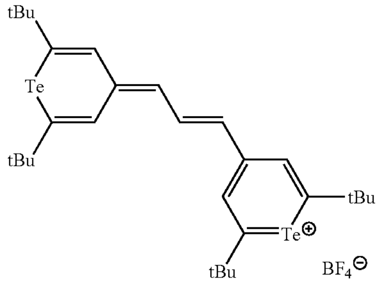
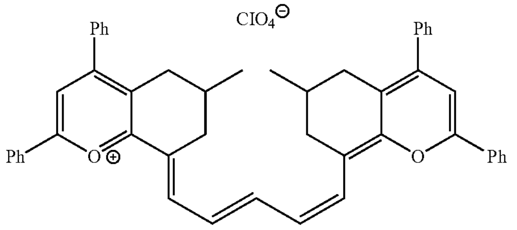
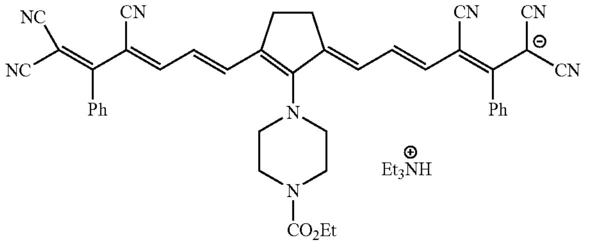
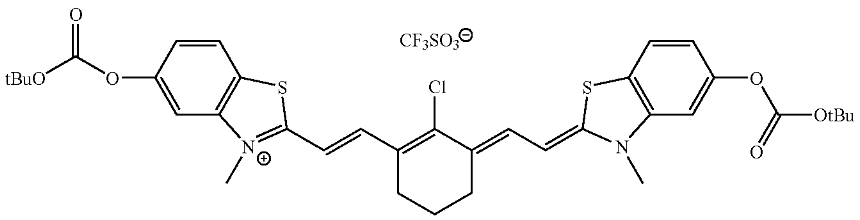
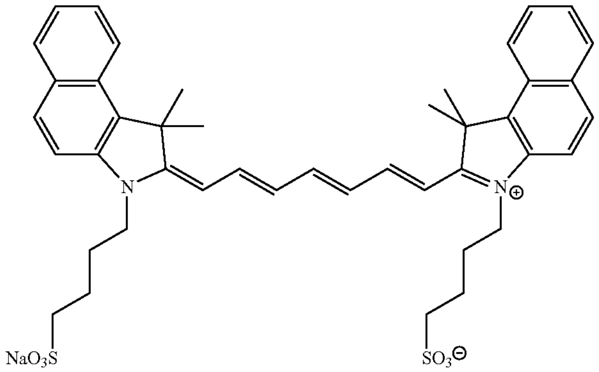

-continued

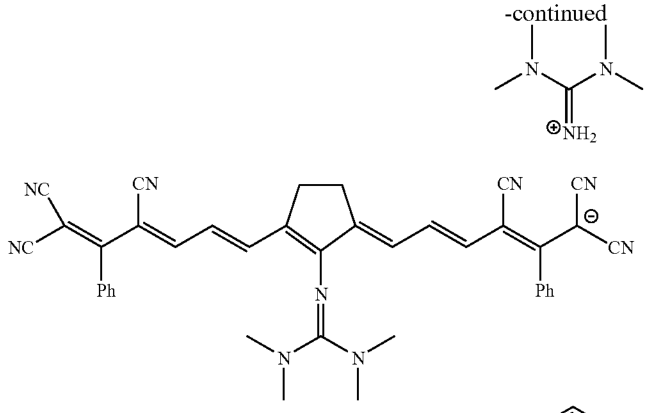

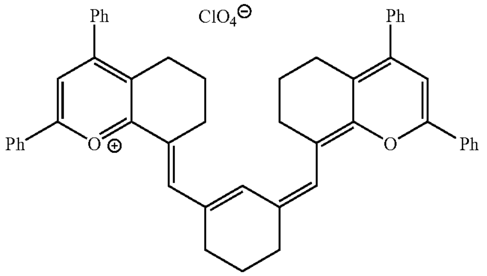

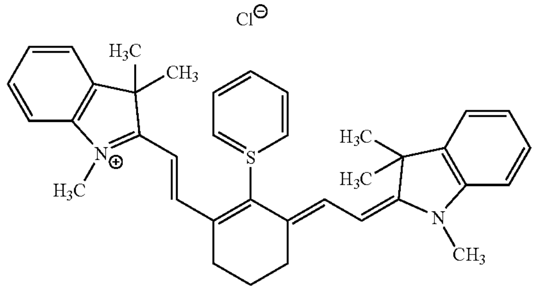

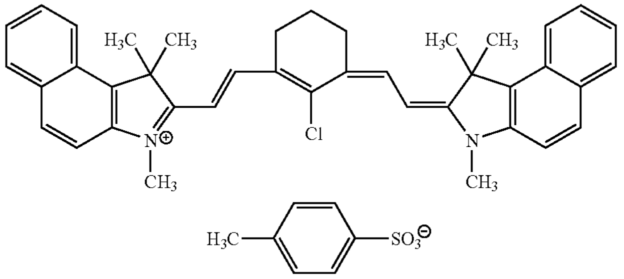

If an IR absorber is present in the first layer its amount is preferably at least 1 wt % based on the dry layer weight of the first layer, more preferably at least 3 wt %, most preferably at least 5 wt %. Usually, the amount of IR absorber does not exceed 50 wt %, preferably 30 wt % and most preferably 20 wt %. If carbon black is used as IR absorber, it is preferably used in an amount of no less than 40%. Either a single IR absorber or a mixture of two or more can be present; in the latter case, the amounts given refer to the total amount of all IR absorbers.

In addition to low-molecular IR absorbers, IR dyes covalently bonded to a polymer can be used as well in the first layer whereby the polymer used is soluble in aqueous alkaline solutions (see e.g. DE 10 2004 029 503 A1). In such a case, no additional first polymer is required in the first layer. In addition to IR dyes covalently bonded to a polymer, in the first layer IR dye cations can be used as well (i.e. the cation is the IR absorbing portion of the dye salt) which ionically interact with a polymer comprising —COOH, $—SO_3H$, $—PO_3H_2$ and/or $—PO_4H_2$ groups in its side chains (see e.g. DE 10 2004 029 501 A1).

The first layer can furthermore comprise dyes or pigments having a high absorption in the visible spectral range in order to increase the contrast ("contrast dyes and pigments"). Particularly suitable dyes and pigments are those that dissolve well in the solvent or solvent mixture used for coating or are easily introduced in the disperse form of a pigment. Suitable contrast dyes include inter alia rhodamine dyes, triarylmethane dyes such as Victoria blue R and Victoria blue B0, crystal violet and methyl violet, anthraquinone pigments, azo pigments and phthalocyanine dyes and/or pigments. The colorants are preferably present in the first layer in an amount of 0 to 15 wt %, more preferred 0.5 to 10 wt %, particularly preferred 1.5 to 7 wt %, based on the dry layer weight.

Furthermore, the first layer can comprise surfactants (e.g. anionic, cationic, amphoteric or non-ionic tensides or mixtures thereof). Suitable examples include fluorine-containing polymers, polymers with ethylene oxide and/or propylene oxide groups, sorbitol-tri-stearate and alkyl-di-(aminoethyl)-glycines. They are preferably present in an amount of 0 to 10 wt %, based on the dry layer weight, especially preferred 0.2 to 5 wt %.

The first layer can furthermore comprise print-out dyes such as crystal violet lactone or photochromic dyes (e.g. spiropyrans etc.). They are preferably present in an amount of 0 to 15 wt %, based on the dry layer weight, especially preferred 0.5 to 5 wt %.

Also, flow improvers can be present in the first layer, such as poly(glycol)ether-modified siloxanes; they are preferably present in an amount of 0 to 1 wt %, based on the dry layer weight.

The first layer can furthermore comprise antioxidants such as e.g. mercapto compounds (2-mercaptobenzimidazole, 2-mercaptobenzthiazole, 2-mercaptobenzoxazole and 3-mercapto-1,2,4-triazole), and triphenylphosphate. They are preferably used in an amount of 0 to 15 wt %, based on the dry layer weight, especially preferred 0.5 to 5 wt %.

Other coating additives can of course be present as well.

Furthermore, in addition to the essential first polymer the first layer can comprise a phenolic resin; like the first polymer they are soluble in aqueous alkaline developers, but contrary to them they are also soluble in organic solvents of low polarity.

If the first layer comprises a phenolic resin (such as novolaks and resols, preferably resols) as an optional component, it is preferably present in an amount of no more than 30 wt %, based on the dry layer weight, more preferably no more than 25 wt %, most preferably no more than 10 wt %. According to one specific embodiment, the first layer does not contain a phenolic resin.

Suitable phenolic resins are condensation products of one or more suitable phenols, e.g. phenol itself, m-cresol, o-cresol, p-cresol, 2,5-xylenol, 3,5-xylenol, resorcinol, pyrogallol, phenylphenol, diphenols (e.g. bisphenol-A), trisphenol, 1-naphthol and 2-naphthol with one or more suitable aldehydes such as formaldehyde, acetaldehyde, propionaldehyde, benzaldehyde and furfuraldehyde and/or ketones such as e.g. acetone, methyl ethyl ketone and methyl isobutyl ketone. The type of catalyst and the molar ratio of the reactants determine the molecular structure and thus the physical properties of the resin. Phenylphenol, xylenols, resorcinol and pyrogallol are preferably not used as the single phenol for condensation but rather in admixture with other phenols. An aldehyde/phenol ratio of about 0.5:1 to 1:1, preferably 0.5:1 to 0.8:1, and an acid catalyst are used in order to produce those phenolic resins known as "novolaks" and having a thermoplastic character. Phenolic resins known as "resols" are obtained at higher aldehyde/phenol ratios and in the presence of alkaline catalysts.

Suitable phenolic resins can be prepared according to known processes or are commercially available. Preferably, the molecular weight (weight average determined by means of gel permeation chromatography using polystyrene as standard) is between 1,000 and 15,000, especially preferred between 1,500 and 10,000.

In addition to the novolaks and resols mentioned above, modified novolaks/resols, e.g. tosylated novolaks, can also be used. (Meth)acrylates with phenolic groups (e.g. terpolymers or tetrapolymers) can be used as optional components as well.

Second Layer

The second layer of the imagable element of the present invention comprises a second polymer soluble or swellable in aqueous alkaline developers which is different from the first polymer and comprises vinyl acetal repeating units and pendant acidic groups selected from COOH, $—SO_3H$, $—PO_3H_2$, $—PO_4H_2$, aromatic OH and groups having acidic amide or imide groups. It is to be understood that the pendant acidic group can be present within the acetal repeating unit or can be present in a different repeating unit. In the framework of the present invention the expression "acidic amide group" also encompasses acidic sulfonamide groups.

The second layer accepts ink and is insoluble/impenetrable in/by aqueous alkaline developer but is rendered soluble in or penetrable by the developer by IR radiation.

It is preferred that the second layer is the outermost layer of the imagable element.

Besides vinyl acetal repeating units and repeating units with pendant acid groups, the second polymer (here and after also called polyvinyl acetal copolymer) usually comprises a unit (A)

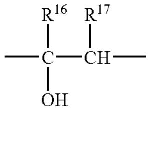

(A)

and optionally a unit (B)

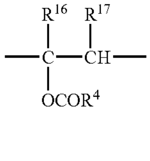

(B)

with $R^4$ being selected from H and $C_1$-$C_4$ alkyl, and $R^{16}$ and $R^{17}$ being independently selected from H, halogen and $C_1$-$C_4$ alkyl.

Preferably unit (A) is present in an amount of 10 to 60 mole % (more preferably 15 to 50 mole %, even more preferred 15 to 40 mole %), and unit (B) is present in an amount of 0 to 30 mole % (more preferably 0.1 to 30 mole %; especially preferred are 1 to 15 mole %) based on all units present in the polyvinyl acetal copolymer.

According to one embodiment the second polymer comprises structural units (A) and (C), and optionally (B), wherein unit C is at least one acetal unit selected from (C-1), (C-2), (C-3) and (C-4) and optionally at least one unit selected from (C-5), (C-6), (C-7) and (C-8):

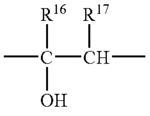

(A)

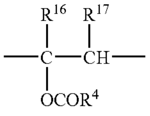

(B)

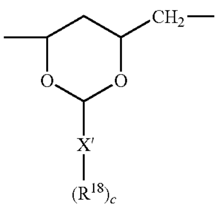

(C-1)

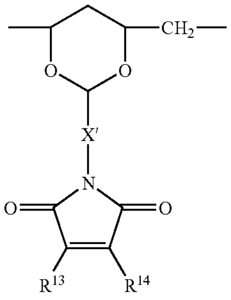

(C-2)

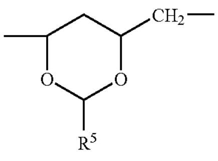

(C-3)

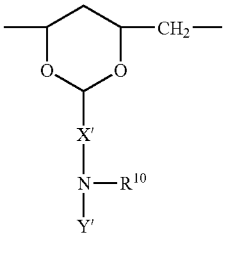

(C-4)

-continued (C-5)

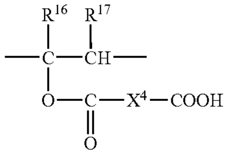

(C-6)

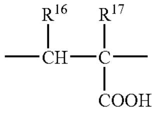

(C-7)

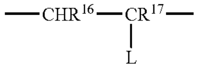

(C-8)

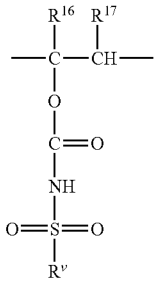

wherein $R^4$ represents H or $C_1$-$C_4$ alkyl, $R^5$ represents H, $C_1$-$C_{18}$ alkyl, aryl or $C_2$-$C_{18}$ alkenyl, $R^{16}$ independently represents H, halogen or $C_1$-$C_4$ alkyl $R^{17}$ independently represents H, halogen or $C_1$-$C_4$ alkyl, $R^{18}$ independently represents —OH, —O-tosyl, —O-naphthyl, —COOH, $—CH_2)_a$—COOH, —O—$(CH_2)_a$—COOH, $—SO_3H$, $—PO_3H_2$ or $—PO_4H_2$, a is an integer from 1 to 8, c is an integer from 1 to 5, X' is independently an aliphatic, aromatic or araliphatic spacer, Y' is selected from —CO—$X^4COOR^{20}$ and —$SO_2R^{21}$, L either is the group —NH—CO—R' or —CO—NH—R", wherein R' is selected from a hydrogen atom, an alkyl, alkenyl and aryl groups optionally substituted with a carboxyl group and R" is a $C_1$-$C_6$ hydrocarbon group optionally substituted with one or more hydroxyl groups, $C_1$-$C_3$ ether or amino groups, mono-$C_1$-$C_3$-alkylamino, di-$C_1$-$C_3$-alkylamino or carboxyl groups, or is an aryl group comprising at least one carboxyl or sulfonic acid group, $R^V$ is selected from an alkyl group and an aryl group, $R^{10}$ is selected from H, an alkyl, aryl, aralkyl and alkenyl group, $R^{13}$ and $R^{14}$ are independently selected from a hydrogen atom and an alkyl group or $R^{13}$ and $R^{14}$, together with the two carbon atoms to which they are bonded, form a 5- or 6-membered carbocyclic ring, $R^{20}$ is selected from a hydrogen atom and an alkyl group, $R^{21}$ is selected from an alkyl, aralkyl and aryl group, $X^4$ is selected from $$—(CR^6R^7)_k— \text{ and } —CR^8{=}CR^9—$$

wherein k is an integer from 1 to 6, each group $R^6$ and $R^7$ is independently selected from a hydrogen atom and a $C_1$-$C_6$ alkyl group, and $R^8$ and $R^9$ are independently selected from a hydrogen atom and a $C_1$-$C_6$ alkyl group, or $R^8$ and $R^9$, together with the two carbon atoms to which they are bonded, form an optionally substituted aryl or heteroaryl group.

$X^4$ is selected from $$—(CR^6R^7)_k— \text{ and } —CR^8{=}CR^9—$$

wherein k is an integer from 1 to 6, each group $R^6$ and $R^7$ is independently selected from a hydrogen atom and a $C_1$-$C_6$ (preferably $C_1$-$C_4$) alkyl group (if k>1, not all groups $R^6$ have to be the same, nor do all groups $R^7$ have to be the same), and $R^8$ and $R^9$ are independently selected from a hydrogen atom and a $C_1$-$C_6$ (preferably $C_1$-$C_4$) alkyl group, or $R^8$ and $R^9$, together with the two carbon atoms to which they are bonded, form an optionally substituted aryl or heteroaryl group. (The optionally substituted aryl group can e.g. be an optionally substituted phenyl or naphthyl group, an unsubstituted phenyl group being preferred. The optionally substituted heteroaryl group usually exhibits 5 or 6 ring atoms, one or more of which (preferably 1 or 2) are heteroatoms selected from sulfur, oxygen and nitrogen atoms. Preferred heteroaryl groups comprise 1 oxygen atom, 1 sulfur atom or 1-2 nitrogen atoms. Suitable substituents for the aryl and heteroaryl groups are $C_1$-$C_4$ alkyl groups, $C_1$-$C_4$ haloalkyl groups, cyano groups, $C_1$-$C_4$ alkoxy groups and —COOH. The number of substituents—if present—is usually 1 to 3, however, unsubstituted aryl and heteroaryl groups are preferred).

It is especially preferred that $X^4$ be selected from:

$$—CR^{1a}R^{1b}—CR^{1c}R^{1d}—;\ —CR^{1e}{=}CR^{1f}—$$

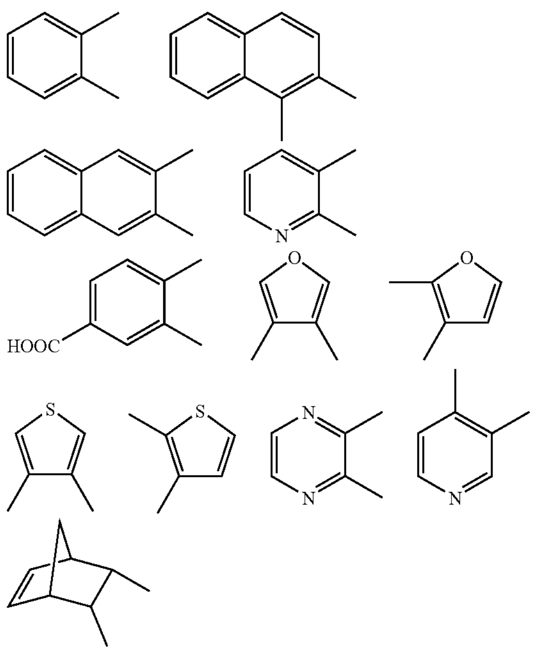

wherein $R^{1a}$ to $R^{1f}$ are each independently selected from a hydrogen atom and a $C_1$-$C_6$ (preferably $C_1$-$C_4$—) alkyl group; preferably, $R^{1a}$ to $R^{1f}$ each represent a hydrogen atom.

$R^{10}$ is preferably a hydrogen atom or a $C_1$-$C_4$ alkyl group (preferably a methyl group), especially preferred H or $CH_3$.

$R^{13}$ and $R^{14}$ are independently a hydrogen atom or a $C_1$-$C_4$ alkyl group (preferably a methyl group).

In formulae (C-2) and (C-4) X' is preferably an aliphatic spacer and especially preferred —($CR^{22}R^{23}$)—, wherein $R^{22}$ and $R^{23}$ are independently preferably selected from a hydrogen atom and an alkyl group (preferably $C_1$-$C_4$ alkyl, especially —$CH_3$) and it is especially preferred that they are H.

In formula (C-1) X' is preferably an aromatic spacer like an arylene group (e.g. a phenyl ring or a naphthyl ring system) if $(R^{18})_c$ represents one or more OH groups. If at least one $R^{18}$ is different from OH, X' preferably represents an arylene or alkylene spacer in formula (C-1).

According to one embodiment, X'=naphthylene, with $R^{18}$ being bonded to one of the phenyl rings and the acetal group being bonded to the other phenyl ring of the naphthylene unit.

$R^4$ is preferably $C_1$-$C_4$ alkyl, more preferably $CH_3$.

$R^5$ is preferably $C_1$-$C_{18}$ alkyl, more preferably $C_1$-$C_6$ alkyl.

$R^{16}$ and $R^{17}$ are independently preferably H or $C_1$-$C_4$ alkyl, more preferably H or $CH_3$.

c is preferably an integer from 1 to 3, more preferably 1.

The polyvinyl acetals used in one embodiment of the present invention preferably show an acid number of 70 mg KOH/g polymer or less, more preferably 50 mg KOH/g polymer or less, especially preferred 30 mg KOH/g polymer or less and particularly preferred 20 mg KOH/g polymer or less. An acid number of 0 is possible as well. The term "acid number" denotes the number of mg of KOH determined by titration which is necessary for neutralizing 1 g of polymer.

It is also possible to use a second polymer which comprises a combination of different units A and/or a combination of different units B and/or a combination of different units C. In such a case, the amounts given for A, B and C, respectively refer to the total amount of all units A, all units B and all units C, respectively. The ratio of units A, B and C in the polyvinyl acetals of the present invention is not particularly restricted; according to one embodiment, the following ratios are preferred:

Unit A 10 to 60 mole % (especially preferred 15 to 50 mole %),

Unit B 0.1 to 30 mole % (especially preferred 1 to 15 mole %) and

Unit C 20 to 80 mole % (especially preferred 35 to 65 mole %).

Dependent on whether or not further components are present in the second layer, the amount of the second polymer can be up to 100 wt % based on the dry layer weight of the second layer, more preferably 5 to 100 wt %.

According to one embodiment of the present invention the second layer comprises 10 to 99.9 wt % of at least one polyvinyl acetal as defined below, preferably 30 to 99 wt %, more preferred 50 to 95 wt %. The remaining can for instance be an IR absorber.

The vinyl alcohol/vinyl acetate copolymers that serve as starting materials in the preparation of the polyvinyl acetal copolymers used in the present invention are preferably hydrolyzed to a degree of 70 to 98 mole % and usually have a weight-average molecular weight $M_w$ of 20,000 to 130,000 g/mole. Exactly which copolymer is used as a starting material for the synthesis, depends on the desired future application of the heat-sensitive element. For offset printing plates, polymers with a weight-average molecular weight $M_w$ of 35,000 to 130,000 g/mole and a degree of hydrolysis of the vinyl acetate structural unit of 80 to 98 mole % are preferably used.

The polyvinyl acetals can be produced according to known methods. Polyvinyl acetals suitable for the present invention and their production are described in detail e.g. in U.S. Pat. No. 5,169,897, DE 34 04 366 B1 and DE 100 11 096 A1.

According to one embodiment of the present invention the second layer of the element furthermore comprises at least one photothermal conversion material ("IR absorber"). The same IR absorber as mentioned above for the first layer can be used. It is also possible that an IR absorber is present in both the first and second layer; preferably it is however present only in one of these layers.

If the IR absorber is present in the second layer, its amount is preferably at least 0.1 wt % based on the dry layer weight of the second layer, more preferably at least 1 wt %, most preferably at least 1.5 wt %. Usually, the amount of IR absorber does not exceed 50 wt %, preferably 30 wt % and most preferably 20 wt %. The IR absorber can for example be present in an amount of 0.2 to 0.5 wt %. If carbon black is used as IR absorber, it is preferably used in an amount of no less than 40%. Either a single IR absorber or a mixture of two or more can be present; in the latter case, the amounts given refer to the total amount of all IR absorbers.

In the second layer, phenolic resins can be present as optional components in addition to the polyvinyl acetal; they can be present in an amount of up to 60 wt %, especially preferred up to 30 wt %.

In addition to the novolaks and resols mentioned above as optional component for the first layer, modified novolaks/resols, e.g. tosylated novolaks, as described for example in U.S. Pat. No. 6,358,669 and U.S. Pat. No. 6,555,291 B1 can also be used in the second layer.

According to one embodiment of the present invention, the second layer does not comprise any phenolic resins in addition to the polyvinyl acetal (or mixture of polyvinyl acetals).

Furthermore, the second layer can comprise dyes or pigments having a high absorption in the visible spectral range. Those mentioned above in connection with the first layer are for example suitable. The colorants are preferably present in an amount of 0 to 5 wt %, more preferred 0.5 to 3 wt %, based on the dry layer weight of the second layer.

The surfactants mentioned in connection with the first layer can be present in the second layer as well. Here, they are preferably present in an amount of 0 to 2 wt %, more preferred 0 to 0.5 wt %, based on the dry layer weight of the second layer.

The second layer can also comprise acid formers which release acids upon application of heat. Examples include triazines, diazonium, iodonium, sulphonium, phosphonium, ammonium, oxysulphoxonium, oxysulphonium and sulphoxonium salts with non-nucleophilic anions such as tetrafluoroborate, hexafluorophosphate, hexafluoroarsenate, hexafluoro-antimonate, triflate, tetrakis(pentafluorophenyl) borate, pentafluoroethylsulfonate, p-methylbenzylsulfonate, ethylsulfonate, trifluoromethylacetate and pentafluoroethylacetate anions. But also $C_1$-$C_5$ alkylsulfonates, arylsulfonates, N—$C_1$-$C_5$ alkylsulfonylsulfonamides, such as for example benzoin tosylate, 2-hydroxymethylbenzoin tosylate and N-methanesulfonyl-2,4-dimethylbenzolsulfonamide and combinations of two or more of the above. They are preferably present in an amount of 0 to 25 wt %, more preferred 0 to 10 wt %, particularly preferred 0 to 5 wt %, based on the dry layer weight of the second layer. According to a preferred embodiment, no acid former is present.

Furthermore, the second layer composition can comprise flow improvers such as poly(glycol)ether-modified starch. They are preferably present in an amount of 0 to 1 wt %, based on the dry layer weight of the second layer.

The use of cross-linkable enol ethers in the second layer is not within the scope of the present invention.

According to one embodiment of the present invention, the second layer consists of only a polyvinyl acetal or a mixture of polyvinyl acetals.

FIRST PREFERRED EMBODIMENT

The polyvinyl acetal used in the second layer of one embodiment of the present invention comprises the following structural units (A), (C-1a), and optionally (B); as further structural units (C-3), (C-1b) and (C-1c) can optionally be present:

(C-1a)

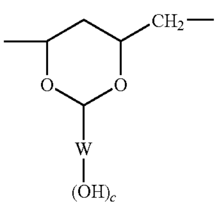

(C-1b)

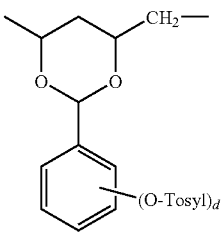

(C-1c)

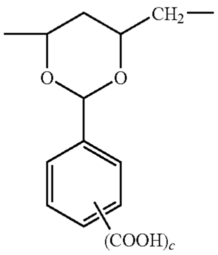

wherein units (A), (B) and (C-3) are as defined above,

W is an arylene group, c is an integer from 1 to 5 (preferably 1 to 3, especially preferred 1), and d is an integer from 1 to 3 (preferably 1).

If c=1 in unit (C-1a) and W=phenylene, the one hydroxy group is preferably in p-position.

In structural unit (C-1b), 1 to 3-O-tosyl groups can be bonded at the phenyl ring; if only one —O-tosyl group is present, it is preferably in p-position.

If c=1 in unit (C-1c), the one carboxy group is preferably in p-position.

According to one embodiment, the polyvinyl acetal comprises the units (A), (B), (C-1a) and (C-1b). According to another embodiment, at least one unit (C-3) and/or (C-1c) is present in addition to the units (A), (B), (C-1a) and (C-1b).

Preferably, the amounts of each unit in the first preferred embodiment are as follows:

Unit (A) 10 to 60 mole % (especially preferred 15 to 40 mole %), unit (B) 0.1 to 30 mole % (especially preferred 1 to 15 mole %), unit (C-1a) 10 to 80 mole % (especially preferred 40 to 60 mole %), unit (C-3) 0 to 50 mole % (especially preferred 10 to 30 mole %), unit (C-1b) 0 to 50 mole % (especially preferred 10 to 30 mole %), and unit (C-1c) 0 to 20 mole % (especially preferred 0 to 5 mole %).

In this first preferred embodiment the second layer preferably comprises at least one photothermal conversion material and 10 to 99.9 wt % of polyvinyl acetal(s).

SECOND PREFERRED EMBODIMENT

The polyvinylacetal used in the second layer of another embodiment of the present invention comprises 5 to 100 wt % polyvinyl acetal(s) with an acid number of 50 mg KOH/g polymer or less. The photothermal conversion material is present in the first layer. The polyvinylacetal preferably comprises units (A), (B), (C-3), and at least one of (C-5) and (C-1a) as defined above wherein in (C-1a) W=phenylene and c=1 and $R^{18}$ is as defined above.

Preparation

For producing an imagable element according to the present invention a first coating composition is applied to the hydrophilic surface of the substrate. Common coating devices can be used for applying the coating solutions; the coating solutions can e.g. be applied by means of spin coating, coating with doctor blades, roller coating, gravure coating or coating with a slot nozzle (also referred to as slot coater, Hopper coater). Usually, the first coating composition is applied from a polar solvent or solvent mixture.

The dry layer weight of the first layer is preferably 0.1 to 5 $g/m^2$, more preferred 1 to 3 $g/m^2$.

The second layer can be applied over the first layer by the same coating methods as described above. Usually, a solvent or solvent mixture with low polarity is used in order to avoid that the first layer dissolves.

The dry layer weight of the second layer is preferably 0.1 to 5 $g/m^2$, more preferred 0.3 to 1.5 $g/m^2$.

Although it is possible to provide a coating consisting of the two layers on both sides of the substrate it is preferred that it is only applied to one side of the substrate.

Conditioning

After drying the layers, the imagable element can optionally be further “conditioned” with a heat treatment at a temperature of from about 40 to about 90° C. for at least 4 hours (preferably at least 20 hours) under conditions that inhibit the removal of moisture from the dried layers. More preferably, the heat treatment is carried out at a temperature of from about 50 to about 70° C. for at least 24 hours. During the heat treatment, the imagable element is generally wrapped or encased in a water-impermeable sheet material to represent an effective barrier to moisture removal from the precursor, or the heat treatment of the imagable element is carried out in an environment in which relative humidity is controlled to at least 25%. In addition, the water-impermeable sheet material can be sealed around the edges of the imagable element using a water-impermeable sheet material that is a polymeric film, metal foil, or waterproof paper.

In some embodiments, this heat treatment can be carried out with a stack comprising at least 100 of the same imagable elements (preferably from about 500 elements), or when the imagable element is in the form of a coil. If a stack of imagable element is heat-treated, they can be separated by suitable interleaving papers.

Imaging

Imaging of the imagable elements according to the present invention can be carried out by exposure to near IR and IR irradiation (600 to 1500 nm) followed by a developing step. As a radiation source, semiconductor lasers or laser diodes which emit in the range of 650 to 1,300 nm, preferably 750 to 1,120 nm, are for example used. The laser radiation can be digitally controlled via a computer, i.e. it can be turned on or off so that an image-wise exposure of the plates can be effected via stored digitized information in the computer which results in so-called computer-to-plate (ctp) printing plates. All image-setting units with IR lasers known to the person skilled in the art can be used for this purpose. The IR radiation causes the initially developer-insoluble second layer of the present invention to become soluble in an aqueous alkaline developer, dispersible therein or penetrable thereby.

The image-wise irradiated/heated elements such as e.g. printing plate precursors are developed with an aqueous alkaline developer (including so-called solvent based developers which in addition to water also contain a small amount of organic solvent), which typically has a pH value in the range of 8 to 14, preferably 10 to 14. For this purpose, commercially available developers and mixtures thereof can be used. To the person skilled in the art, it goes without saying that the developer composition can be optimized for specific printing plate precursors based on the polymers used in the first and second layers. In order to avoid the formation of sludge in the developer bath, it can be advantageous for some coatings to use a mixture of a conventional positive developer and a conventional negative developer; such mixtures usually have a pH value in the range of 12 to 14 and in addition to alkali(meta) silicates and tensides often also contain small amounts of organic solvents (like Dowanol EPH) and optionally amines (like diethanolamine). The first layer and the second layer are removed by the developer in the exposed areas thereby revealing the hydrophilic surface of the substrate.

Developed printing plates can additionally be subjected to a baking step in order to increase the abrasion resistance of the printing areas; however, this is not absolutely necessary in the case of the printing plates of the present invention since very high numbers of copies can be printed without any deterioration in quality.

Under typical processing conditions for printing plates, the printing plate precursors of the present invention are preferably not sensitive to visible light and the UV portion of daylight (i.e. the coating does not comprise any components sensitive to UV/Vis) so that they can be processed under white light and do not require yellow light conditions.

The present invention is described in more detailed in the following examples; however, they are not intended to restrict the invention in any way.

EXAMPLES

Synthesis Example 1

Polyvinyl Acetal 1

44.05 g Mowiol® 10-98 (polyvinyl alcohol from Kuraray Specialities Europe; degree of hydrolysis about 98 mole %; content of residual acetate groups about 1.5 wt %; viscosity of a 4% aqueous solution at 20° C. approx. 10 mPa·s according to DIN 53015) were dissolved in 280 ml DMSO at 60° C. in a nitrogen atmosphere. To this solution, 4.32 g of 32% HCl were added. A mixture of 22.41 g 4-hydroxybenzaldehyde and 50.70 g 4-tosyloxybenzaldehyde dissolved in 50 ml DMSO was added under stirring. The mixture was left to react for 4 hours at 60° C. and the polyvinyl acetal 1 was then precipitated in water. The polyvinyl acetal 1 was filtered off, washed and dried at 40° C.

The resulting product (acid number=0) comprised the following structural units in the amounts given in mole %:

| | |
|---|---|
| Vinyl alcohol (structural unit A) | 37.2 mole % |
| Acetate (structural unit B) | 3.2 mole % |
| Acetal derived from 4-hydroxybenzaldehyde (structural unit C-1) | 29.8 mole % |
| Acetal derived from 4-tosyloxybenzaldehyde (structural unit C-1) | 29.8 mole % |

Synthesis Example 2

Polyvinyl Acetal 2

103.125 g Mowiol® 10-98 were dissolved in 975 ml DMSO at 60° C. To this solution, 11.25 ml of 30% HCl were added. A mixture of 10.68 g acetaldehyde, 40.8 g butyraldehyde and 7.9 g 4-formylbenzoic acid dissolved in 30 ml DMSO was added under stirring. The mixture was left to react for 4 hours at 60° C. and the polyvinyl acetal 2 was then precipitated in water. The polyvinyl acetal 2 was then filtered off, washed and dried at 40° C.

The resulting product (acid number=20) comprised the following structural units in the amounts given in mole %:

| | |
|---|---|
| Vinyl alcohol (structural unit A) | 36.8 mole % |
| Acetate (structural unit B) | 3.24 mole % |
| Acetal derived from acetaldehyde (structural unit C-3) | 16.9 mole % |
| Acetal derived from butyraldehyde (structural unit C-3) | 39.4 mole % |
| Acetal derived from 4-formylbenzoic acid (structural unit C-1) | 3.66 mole % |

Synthesis Example 3

Polyvinyl Acetal 3

To a solution of 15 g Mowital® B30T (polyvinyl butyral from Kuraray Specialities Europe; low degree of acetalization) in 150 g methyl ethyl ketone 1.01 g of maleic acid anhydride were added at 60° C. After the anhydride had dissolved, 0.30 g triethyl amine were added slowly and the mixture was stirred for 4 hours at 80° C. The polymer was precipitated in 1 l of water, filtered off, washed and dried (fluidized-bed drier).

The reaction introduced a structural unit C-5 into the polyvinyl butyral (structural units A, B and C-3).

| | |
|---|---|
| Vinyl alcohol (structural unit A) | 45.7 mole % |
| Acetate (structural unit B) | 3 mole % |
| Acetal derived from butyraldehyde (structural unit C-3) | 46.7 mole % |
| Structural unit derived from maleic acid anhydride (structural unit C-5) | 4.6 mole % |

The product had an acid number of 27.

Synthesis Example 4

Polyvinyl Acetal 4

15 g Mowital B30T were dissolved at room temperature and then for 1 hour at 40° C. in 150 g methyl ethyl ketone (dried for 1 day with a molecular sieve). 1.01 g of toluene sulfonyl isocyanate were added and stirred for at least 3 hours at room temperature and then for 1 hour at 40° C. A polymer solution was obtained which turned into a gel upon cooling and became slightly mobile when heated to 60° C.

The warm polymer solution was poured into 1 l of water for precipitating the polymer, the polymer was filtered off, washed and dried (fluidized-bed drier).

The acid number of the polymer was determined to be 18. The reaction introduced a structural unit C-8 into the polyvinyl butyral.

| | |
|---|---|
| Vinyl alcohol (structural unit A) | 49.2 mole % |
| Acetate (structural unit B) | 2.9 mole % |
| Acetal derived from butyraldehyde (structural unit C-3) | 45.6 mole % |
| Structural unit derived from p-toluene sulfonyl isocyanate (structural unit C-8) | 2.3 mole % |

Synthesis Example 5

Polyvinyl Acetal 5

25.78 g Mowiol® 10-98 were dissolved in 240 ml DMSO at 60° C. in a nitrogen atmosphere. To this solution, 2.3 ml of 30% HCl were added. A mixture of 2.75 g acetaldehyde, 10.3 g butyraldehyde and 1.59 g 4-hydroxybenzaldehyde dissolved in 15 ml DMSO was added under stirring. The mixture was left to react for 4 hours at 60° C. and the polyvinyl acetal 5 was subsequently precipitated in water. Then the polymer was filtered off, washed and dried at 40° C.

The resulting polymer comprised structural units A, B, C-1 and C-3.

The product had an acid number of 0.

| | |
|---|---|
| Vinyl alcohol (structural unit A) | 35.4 mole % |
| Acetate (structural unit B) | 3.2 mole % |
| Acetal derived from acetaldehyde (structural unit C-3) | 17.6 mole % |
| Acetal derived from butyraldehyde (structural unit C-3) | 40.1 mole % |
| Acetal derived from 4-hydroxybenzaldehyde (structural unit C-1) | 3.7 mole % |

Synthesis Examples 6 to 22

Polyvinyl Acetals 6 to 22

The syntheses were carried out analogously to Synthesis Example 1. Information regarding the starting compounds and their amounts can be inferred from Table 1.

TABLE 1

| Polyvinyl acetal no. | Mowiol ® type | Mowiol ® amount (g) | Aldehyde[1] amount (g) | Aldehyde[2] amount (g) | Aldehyde[3] amount (g) | Aldehyde[4] amount (g) | Aldehyde[5] amount (g) |
|---|---|---|---|---|---|---|---|
| 1 | 10-98 | 44.05 | 22.41 | 50.70 | | | |
| 6 | 10-98 | 44.05 | 61.06 | | | | |
| 7 | 10-98 | 68.75 | 69.97 | | | | |
| 8 | 10-98 | 44.05 | 44.82 | | 3.61 | | |
| 9 | 10-98 | 44.05 | 16.85 | 29.01 | | | |
| 10 | 10-98 | 44.05 | 16.85 | 19.34 | | | |
| 11 | 10-98 | 44.05 | 16.85 | 9.67 | | | |
| 12 | 10-98 | 44.05 | 27.23 | 50.56 | | | |
| 13 | 10-98 | 44.05 | 32.12 | 50.56 | | | |
| 14 | 10-98 | 44.05 | 38.71 | 13.82 | | | |
| 15 | 10-98 | 44.05 | 38.71 | 27.60 | | | |
| 16 | 10-98 | 44.05 | 38.71 | 27.63 | | | 2.55 |
| 17 | 4-88[6] | 48.86 | 38.71 | 27.63 | | | |
| 18 | 5-88[7] | 48.86 | 38.71 | 27.63 | | | |
| 19 | 3-98[8] | 44.05 | 38.71 | 27.63 | | | |
| 20 | 10-98 | 44.05 | 38.71 | 27.63 | | 3.00 | |
| 21 | 6-98[9] | 44.05 | 38.71 | 27.63 | | | |
| 22 | 8-88[10] | 48.86 | 38.71 | 27.63 | | | |

[1] 4-hydroxybenzaldehyde
[2] 4-tosyloxybenzaldehyde
[3] n-butyraldehyde
[4] dodecanal
[5] 4-carboxybenzaldehyde
[6] polyvinyl alcohol (degree of hydrolysis about 88%; residual acetyl groups about 10.8 wt %)
[7] polyvinyl alcohol (degree of hydrolysis about 88%; residual acetyl groups about 10.8 wt %)
[8] polyvinyl alcohol (degree of hydrolysis about 97%; residual acetyl groups about 2.7 wt %)
[9] polyvinyl alcohol (degree of hydrolysis about 98%; residual acetyl groups about 1.5 wt %)
[10] polyvinyl alcohol (degree of hydrolysis about 88%; residual acetyl groups about 10.8 wt %)

Synthesis of Polymer A 0.19 g NaOH and 3.53 g of IR-Trump Dye

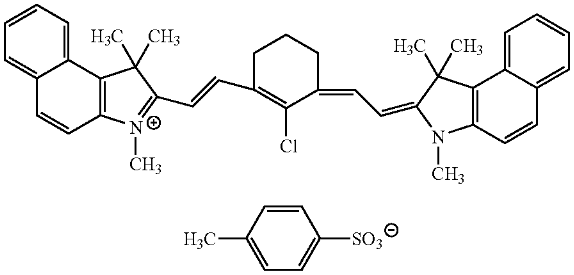

Trump Dye were added to 20 g of a copolymer of methacrylic acid, methacrylamide and N-phenylmaleimide (molar ratio 20:35:45) dissolved in 100 g methoxyethanol. The solution was stirred for 4 hours and then heated to 80° C. A colored polymer was obtained by precipitation in water, which was filtered off and dried.

Example 1

The following coating solution was applied to an aluminum substrate (electrochemically grained, anodized and subjected to an aftertreatment with polyvinylphosphonic acid):

| | |
|---|---|
| 50 ml | 2-methoxyethanol |
| 5.0 g | of a copolymer of methacrylic acid, methacrylamide and N-phenylmaleimide (molar ratio 20:35:45) |
| 0.7 g | Trump Dye (IR absorber) |

The dry layer weight was 2.0 g/$m^2$.

Then the following coating solution was applied for the second layer:

| | |
|---|---|
| 20 g | solvent mixture of 10 wt % water, 35 wt % methanol and 55 wt % methyl glycol |
| 2.5 g | polyvinyl acetal 1 |

The printing plate precursor was dried for 1 minute at 145° C.

The dry layer weight of the second layer was 1.42 g/$m^2$.

The plate was image-wise exposed with a Creo Quantum 800 image-setter (830 nm, 220 rpm, i.e. 112 mJ/$cm^2$ at 10 W) and then developed with a 1:1 mixture of the positive developer Goldstar® commercially available from Kodak Polychrome Graphics and the commercially available negative developer 956 (pH=10) from Kodak Polychrome Graphics.

Examination of the Properties of the Second Layer

For examining the solvent resistance and abrasion resistance of the second layer, the coating solution described in Example 1 was applied directly onto the aluminum substrate and then dried for 1 minute at 145° C. The dry layer weight was 1 g/$m^2$.

As a comparison, a solution of tosylated novolak (m-cresol novolak, degree of tosylation 15 mole %) in a mixture of diethyl ketone and Dowanol PMA (92:8 wt %) was applied onto an aluminum substrate. After drying, the dry layer weight was 1 g/$m^2$ as well.

The solvent resistance was examined by dripping a mixture of cleaner's naphtha:isopropanol:water (84:15:1 wt %) onto the coated plate and letting it sit (dwell time 30 seconds to 4 minutes in 30-second intervals) and then rubbing it with a cloth. The second layer of the present invention showed no attack whatsoever after 4 minutes while the layer of tosylated novolak was removed after a dwell time of only 30 seconds.

The coated aluminum substrates prepared above were furthermore subjected to an abrasion test with a plynometer. For this purpose, a woven plush pad (8×16 cm), soaked with 15 g of abrasive slurry (5% slurry of Syloid® AL-1, available from Graze), was stretched over the coated substrate (7×10 cm). The run time of the plynometer per measurement was 15 minutes. The loss in layer material due to abrasion was determined gravimetrically; in the second layer according to the present invention, the loss was less than 5% while the loss in the second layer of tosylated novolak was 40%.

Example 2

A first layer on the substrate was prepared as described in Example 1 using the following coating composition:

| | |
|---|---|
| 5.80 g | Terpolymer of methacrylic acid, methacrylamide and N-phenylmaleimide (molar ratio 20:35:45) |
| 1.50 g | copolymer of N-phenylmaleimide, methacrylamide, acrylonitrile and the following monomer: 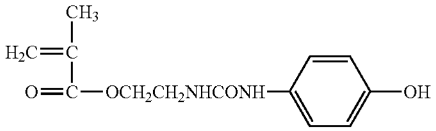 (5:10:45:40 wt %) |
| 4.16 g | resol resin GP649D99 from Georgia-Pacific, Atlanta |
| 1.50 g | Trump Dye |
| 0.15 g | dye D11 from PCAS, France |
| 0.15 g | Byk ® 307 (polyethoxylated dimethyl polysiloxane) |
| 130 g | solvent (γ-butyrolactone:Dowanol PM:methyl ethyl ketone:water, 10:50:30:10 wt %) |

A dry layer weight of 1.3 g/$m^2$ was obtained.

The following coating solution was used to produce the second layer:

| | |
|---|---|
| 2.2 g | polyvinyl acetal 2 |
| 0.3 g | tosylated novolak (m-cresol novolak, degree of tosylation 15 mole %) |
| 0.03 g | Byk 307 |
| 0.032 g | ethyl violet (C.I. 42600) |
| 50 g | solvent mixture (35 g methanol, 5 g Dowanol, 10 g methyl ethyl ketone) |

The printing plate precursor was dried for 1 minute at 145° C.

The dry layer weight of the second layer was 0.4 g/$m^2$.

Image-wise exposure was carried out with a Creo Quantum 800 image-setter (830 nm, 50 to 125 mJ/$cm^2$; 10 W). Developing was carried out with an aqueous alkaline developer comprising sodium metasilicate, Dowanol EPH (2-phenoxyethanol) and diethanolamine (pH=13).

Starting at an exposure energy of 60 mJ/$cm^2$, a clean background was obtained. At an exposure energy of 55 to 125 mJ/$cm^2$, the resolution of high light dots and shadows was good.

Comparative Example 1

A first layer as described in Example 2 was produced on an aluminum substrate.

A tosylated novolak (m-cresol novolak; degree of tosylation 15%) was used as a second layer; dry layer weight 0.4 g/$m^2$ Exposure and developing were carried out as described in Example 2.

A clean background was not obtained until an exposure energy of more than 80 mJ/$cm^2$ was applied; a loss of high light dots was observed when the exposure energy exceeded 110 mJ/$cm^2$.

Example 3

The following coating solution was applied to an aluminum substrate as described above:

| | |
|---|---|
| 5.39 g | Polymer A (prepared according to synthesis described above) |
| 2.45 g | resol resin GP649D99 from Georgia-Pacific, Atlanta |
| 0.092 g | dye D11 from PCAS, France (contrast medium, CAS 433334-19-1) |
| 0.03 g | Byk ® 307 |
| 92 g | solvent mixture (methyl ethyl ketone:Dowanol PM:γ-butyrolactone:water, 65:15:10:10 wt %) |

The dry layer weight was 1.35 g/$m^2$.

The second layer applied to the substrate corresponded to that of Example 2; dry layer weight 0.4 g/$m^2$.

Image-wise exposure was carried out with a Creo Quantum 800 image-setter (830 nm, 71 mJ/$cm^2$). Developing was carried out with an aqueous alkaline developer comprising sodium metasilicate, Dowanol EPH and diethanolamine (pH=13). A clean background was obtained and the resolution of 1×1 pixel elements was excellent.

Example 4

An aluminum substrate as described above was provided with the first layer described in Example 2. As a second layer, the composition described in Example 2 was used, with the exception that the polyvinyl acetal 3 was used instead of the polyvinyl acetal 2; after drying (1 minute at 145° C.) the layer weight was 0.39 g/$m^2$.

Image-wise exposure was carried out with a Creo Quantum 800 image-setter (830 nm, 50 to 99 mJ/$cm^2$; 6 W). Developing was carried out with an aqueous alkaline developer comprising sodium metasilicate, Dowanol EPH and diethanolamine (pH=13).

A clean background was obtained and the resolution was excellent over the entire applied exposure energy range.

Example 5

Example 4 was repeated, but the polyvinyl acetal 4 was used in the second layer. The dry layer weight of the second layer was 0.42 g/$m^2$.

Exposure and developing was carried out as described in Example 4.

A clean background was obtained and the resolution was excellent over the entire applied exposure energy range.

Example 6

Example 4 was repeated, but the polyvinyl acetal 5 was used in the second layer.

Exposure and developing was carried out as described in Example 4.

A clean background was obtained and the resolution was excellent over the entire applied exposure energy range.

Example 7

Abrasion Resistance Test

An aluminum foil was grained electrochemically (Ra=0.6 μm) and anodized (aluminum oxide layer 3.5 g/$m^2$) and subsequently provided with a polyvinyl phosphonic acid interlayer. Onto this treated aluminum substrate, a 10 wt % solution of the various polyvinyl acetals in a mixture of methanol/water/methyl cellosolve (weight ratio 35/10/55) was applied such that a dry layer weight of 1 g/m was obtained.

Then a woven plush pad (8×16 cm), soaked with 15 g of abrasive slurry (5% slurry from Syloid® AL-1, available from Graze, or Primisil®, available from Celite), was stretched over the coated substrate (7×10 cm). The run time of the plynometer per measurement was 15 minutes. The loss in layer material due to abrasion was determined gravimetrically; the results can be inferred from Table 2.

TABLE 2

| Polymer tested | Loss in layer material [%] with low abrasive slurry (Syloid ®) | Loss in layer material [%] with abrasive slurry (Primisil ®) |
|---|---|---|
| Novolak PD140[11] (Comparison) | 60 | 70.0 |
| 1 | | 57.1 |
| 6 | 1 | 26.1 |
| 8 | 3 | 27.9 |
| 9 | | 48.9 |
| 10 | | 32.1 |
| 14 | | 38.2 |
| 15 | | 36.7 |
| 16 | | 42.6 |
| 17 | | 40.4 |
| 18 | | 44.4 |
| 19 | | 29.8 |
| 20 | | 34.0 |
| 21 | | 34.5 |
| 22 | | 37.5 |

[11]m/p-cresol novolak from Borden Chemicals

Example 8

A coating solution comprising 10 wt % of an acrylic terpolymer (methacrylamide:phenylmaleimide:methacrylic acid, 35:40:25 mole %) in a solvent mixture of acetone, water, Dowanol PM and methyl lactate (weight ratio 20/6/39/35) was applied to an aluminum substrate (as described above in connection with the abrasion resistance test) by means of a doctor blade. Drying was carried out with hot air and then for 10 minutes in a 100° C. oven. The dry layer weight was 0.5 g/$m^2$. Then the second layer was formed with a doctor blade; for this purpose, a solution with a solids content of 5 wt % was prepared for which 96.5 wt % polyvinyl acetal 22, 1.5 wt % TrumpDye (IR absorber with cyanine structure) and 2 wt % crystal violet were dissolved in a mixture of methanol, water and methylcellosolve (weight ratio 35/10/55). Drying was carried out with hot air and then for 10 minutes in a 100° C. oven. The dry layer weight of the second layer was determined to be 0.8 g/$m^2$.

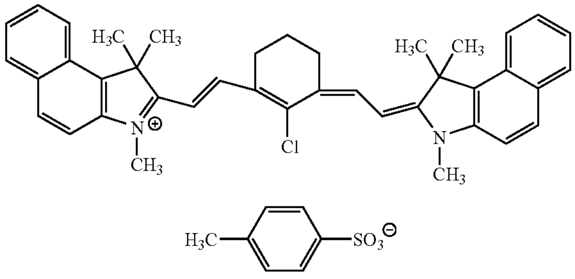

Trump Dye

An abrasion test as described above was carried out with the resulting dual-layer plate. When Syloid® was used, a loss in layer material of 8% was observed.

The IR-sensitive printing plate precursor produced as described above was then image-wise exposed; a screen with 2 to 99% at 150 lines/inch and 1×1 pixel lines was exposed onto the plate. As a radiation source, a Creo Trendsetter 3244 image-setter (830 nm; 150 mJ/$cm^2$, 9.5 W and 100 rpm) was used.

Developing was carried out with an alkaline developer diluted with water in a ratio of 1:1 according to Example 1 of EP 0 366 321 A2 at 23° C.; the developer was first left on the plate for 30 seconds, then it was rubbed over the plate for 10 seconds with a tampon.

A very good image with the highest resolution (1×1 pixel lines were clearly visible) and a clean background was obtained. Printing yielded well resolved images with clean backgrounds. The number of copies was 20% higher than when the commercially available printing plate Electra Excel from Kodak Polychrome Graphics was used.

Solvent resistance was tested by immersing the unexposed plate in methyl ethyl ketone for 4 minutes. After 2 minutes, no attack of the coating whatsoever could be observed visually. After 4 minutes, merely the dye had washed out. This illustrates the extremely high degree of solvent resistance.

Comparative Example 2

Example 8 was repeated, but the second layer was created directly on the aluminum substrate, i.e. without the layer of the acrylic terpolymer.

After irradiation and exposure, an image was obtained, but the background areas were not clean.

Solvent resistance was tested with a drop of methyl ethyl ketone. After a dwell time of 1 minute, no attack of the unexposed coating could be observed.

The Comparative Example shows that the dual-layer structure is necessary to obtain clean background areas.

The invention claimed is:

1. A positive-working imageable element comprising in order:

(a) a substrate with a hydrophilic surface;

(b) a first layer comprising a first polymer soluble or swellable in aqueous alkaline developer and insoluble in organic solvents of low polarity; and (c) a second layer comprising a second polymer soluble or swellable in aqueous alkaline developers, wherein the first polymer is different from the second polymer, wherein the second polymer comprises vinyl acetal repeating units and pendant acidic groups selected from the group consisting of —COOH, —$SO_3H$, —$PO_3H_2$, —$PO_4H_2$, aromatic OH, and groups having acidic amide or imide groups, wherein the element optionally comprises at least one photothermal conversion material, and wherein the second layer accepts ink and is insoluble/impenetrable in/by an aqueous alkaline developer but is rendered soluble in or penetrable by the developer by IR radiation, and the second layer contains no crosslinkable enol ether or phenolic resin.

2. Imageable element according to claim 1, wherein the first layer or the second layer or both comprise at least one photothermal conversion material.

3. A positive-working imageable element, comprising in order:

(a) a substrate with a hydrophilic surface;

(b) a first layer comprising a first polymer soluble or swellable in aqueous alkaline developer and insoluble in organic solvents of low polarity; and (c) a second layer comprising a second polymer soluble or swellable in aqueous alkaline developers, wherein the first polymer is different from the second polymer, wherein the second polymer comprises vinyl acetal repeating units and pendant acidic groups selected from the group consisting of —COOH, —$SO_3H$, —$PO_3H_2$, —$PO_4H_2$, aromatic OH, and groups having acidic amide or imide groups, wherein the element optionally comprises at least one photothermal conversion material, and wherein the second layer accepts ink and is insoluble/impenetrable in/by an aqueous alkaline developer but is rendered soluble in or penetrable by the developer by IR radiation, and the second layer contains no crosslinkable enol ether or phenolic resin, wherein the second polymer comprises structural units (A) and (C), and optionally (B), wherein unit C is at least one acetal unit selected from the group consisting of (C-1), (C-2), (C-3) and (C-4) and optionally at least one unit selected from the group consisting of (C-5), (C-6), (C-7) and (C-8):

(A)

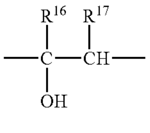

(B)

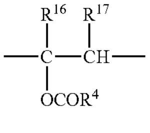

(C-1)

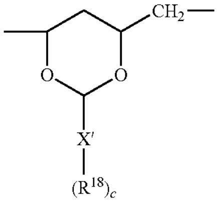

-continued (C-2)

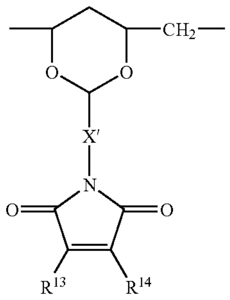

(C-3)

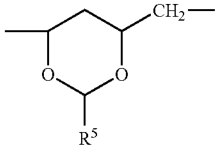

(C-4)

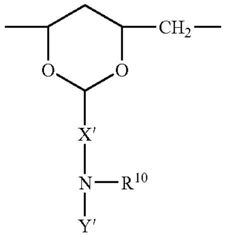

(C-5)

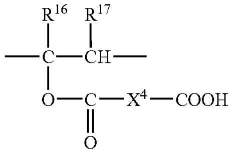

(C-6)

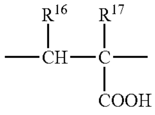

(C-7)

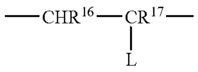

(C-8)

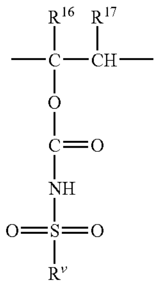

wherein $R^4$ represents H or $C_1$-$C_4$ alkyl, $R^5$ represents H, $C_1$-$C_{18}$ alkyl, aryl or $C_2$-$C_{18}$ alkenyl, $R^{16}$ independently represents H, halogen or $C_1$-$C_4$ alkyl, $R^{17}$ independently represents H, halogen or $C_1$-$C_4$ alkyl, $R^{18}$ independently represents —OH, —O-tosyl, —O-naphthyl, —COOH, —$(CH_2)_a$—COOH, —O—$(CH_2)_a$COOH, —$SO_3H$, —$PO_3H_2$ or —$PO_4H_2$, a is an integer from 1 to 8, c is an integer from 1 to 5, X' is independently an aliphatic, aromatic or araliphatic spacer, Y' is independently selected from —CO—$X^4$—$COOR^{20}$ and —$SO_2R^{21}$, L either is the group —NH—CO—R' or —CO—NH—R", wherein R' is selected from a hydrogen atom, an alkyl, alkenyl and aryl groups optionally substituted with a carboxyl group and R" is a $C_1$-$C_6$ hydrocarbon group optionally substituted with one or more hydroxyl groups, $C_1$-$C_3$ ether or amino groups, mono-$C_1$-$C_3$-alkylamino, di-$C_1$-$C_3$-alkylamino or carboxyl groups, or is an aryl group comprising at least one carboxyl or sulfonic acid group, $R^v$ is selected from an alkyl group and an aryl group, $R^{10}$ is selected from H, an alkyl, aryl, aralkyl and alkenyl group, $R^{13}$ and $R^{14}$ are independently selected from a hydrogen atom and an alkyl group or $R^{13}$ and $R^{14}$, together with the two carbon atoms to which they are bonded, form a 5- or 6-membered carbocyclic ring, $R^{20}$ is selected from a hydrogen atom and an alkyl group, $R^{21}$ is selected from an alkyl, aralkyl and aryl group, $X^4$ is selected from $$—(CR^6R^7)_k— \text{ and } —CR^8{=}CR^9—$$

wherein k is an integer from 1 to 6, each group $R^6$ and $R^7$ is independently selected from a hydrogen atom and a $C_1$-$C_6$ alkyl group, and $R^8$ and $R^9$ are independently selected from a hydrogen atom and a $C_1$-$C_6$ alkyl group, or $R^8$ and $R^9$, together with the two carbon atoms to which they are bonded, form an optionally substituted aryl or heteroaryl group.

4. Imageable element according to claim 3, wherein the second layer comprises 5 to 100 wt % of the second polymer which has an acid number of 50 mg KOH/g polymer or less and wherein the at least one photothermal conversion material is present in the first layer.

5. Imageable element according to claim 4, wherein the first layer furthermore comprises up to 30 wt % of one or more phenolic resins.

6. Imageable element according to claim 4, wherein the second polymer comprises at least one unit (C-3) and at least one unit selected from (C-5) and (C-1) as structural unit C.

7. Imageable element according to claim 4, wherein the structural units (A), (B) and (C) are present in the second polymer in the following amounts:

10 to 60 mole %

0.1 to 30 mole %

20 to 80 mole %.

8. Imageable element according to claim 4, wherein the second layer consists of only the second polymer.

9. Imageable element according to claim 3, wherein the at least one photothermal conversion material is present in the second layer which also comprises 10 to 99.9 wt % of the second polymer comprising the structural units (A) and (C-1a), and optionally (B):

(C-1a)

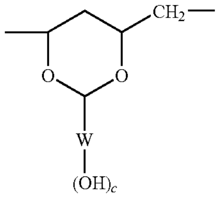

wherein units (A) and (B) are as defined in claim 3,

W is an arylene group, and c is an integer from 1 to 5.

10. Imageable element according to claim 9, wherein the second polymer furthermore comprises at least one of the following structural units (C-3), (C-1b) and (C-1c):

(C-3)

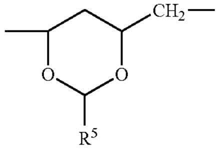

(C-1b)

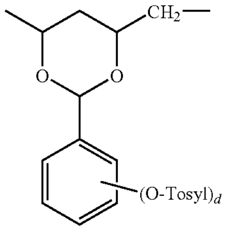

(C-1c)

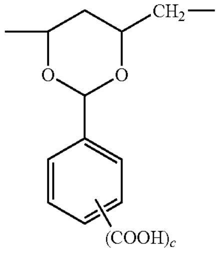

wherein d is an integer from 1 to 3.

11. Imageable element according to claim 10, wherein the second polymer comprises the structural units (A), (B), (C-1a) and (C-1b).

12. Imageable element according to claim 9, wherein the second polymer comprises 10 to 80 mole % of structural unit (C-1a).

13. Imageable element according to claim 10, wherein the second polymer comprises 10 to 30 mole % of structural unit (C-1b).

14. Imageable element according to claim 9, wherein c in structural unit (C-1a) is 1 and the one hydroxy group is bonded to the phenyl group in para position.

15. Imageable element according to claim 10, wherein d in structural unit (C-1b) is 1 and the one O-tosyl group is bonded in para position.

16. Imageable element according to claim 10, wherein c in structural unit (C-1c) is 1 and the one carboxy group is bonded in para position.

17. Imageable element according to claim 10, wherein $R^4$ in structural unit (B) is a methyl group.

18. Imageable element according to claim 2, wherein the photothermal conversion material has the formula (III)

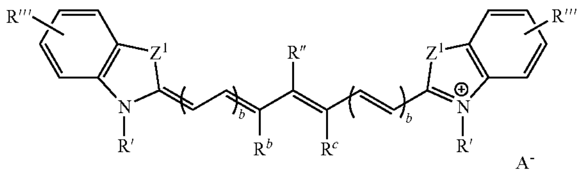

wherein each $Z^1$ independently represents S, O, $NR^a$ or $C(alkyl)_2$;

each R' independently represents an alkyl group, an alkylsulfonate group or an alkylammonium group;

R" represents a halogen atom, $SR^a$, $OR^a$, $SO_2R^a$ or $NR^a_2$;

each R''' independently represents a hydrogen atom, an alkyl group, $—COOR^a$, $—OR^a$, $—SR^a$, $—NR^a_2$ or a halogen atom, or a benzofused ring;

$R^b$ and $R^c$ either both represent hydrogen atoms or, together with the carbon atoms to which they are bonded, form a five- or six-membered carbocylic ring;

A- represents an anion;

$R^a$ represents a hydrogen atom, an alkyl or aryl group;

each b is independently 0, 1, 2 or 3.

19. Process for the production of a positive-working imageable element as defined in claim 1 comprising:

(a) applying a first solution comprising a first polymer soluble or swellable in aqueous alkaline developer and insoluble in organic solvents of low polarity onto a substrate with a hydrophilic surface;

(b) applying a second solution comprising at least one second polymer comprising vinyl acetal repeating units and pendant acidic groups selected from the group consisting of $—COOH$, $—SO_3H$, $—PO_3H_2$, $—PO_4H_2$, aromatic OH, and groups having acidic amide or imide groups;

wherein the first polymer is different from the second polymer and the second solution does not contain a crosslinkable enol ether or phenolic resin, (c) drying; and optionally (d) conditioning of the element obtained in step (c) by heat treating it.

20. Process for the production of an imaged element comprising:

(a) image-wise exposure of an imageable element as defined in claim 2 to near IR or IR radiation and (b) removing the exposed areas of the coating with an aqueous alkaline developer, thereby revealing the hydrophilic surface of the substrate in these areas.

21. Process for the production of a positive-working imageable element as defined in claim 3 comprising:

(a) applying a first solution comprising a first polymer soluble or swellable in aqueous alkaline developer and insoluble in organic solvents of low polarity onto a substrate with a hydrophilic surface;

(b) applying a second solution comprising at least one second polymer comprising vinyl acetal repeating units and pendant acidic groups selected from the group consisting of —COOH, —$SO_3H$, —$PO_3H_2$, —$PO_4H_2$, aromatic OH, and groups having acidic amide or imide groups;

wherein the first polymer is different from the second polymer and the second solution does not contain a crosslinkable enol ether or phenolic resin, (e) drying; and optionally (f) conditioning of the element obtained in step (c) by heat treating it.

22. Process for the production of an imaged element comprising:

(a) image-wise exposure of the imageable element as defined in claim 3 to near IR or IR radiation and (b) removing the exposed areas of the coating with an aqueous alkaline developer, thereby revealing the hydrophilic surface of the substrate in these areas.

* * * * *

UNITED STATES PATENT AND TRADEMARK OFFICE

CERTIFICATE OF CORRECTION

PATENT NO. : 7,781,148 B2
APPLICATION NO. : 11/997564
DATED : August 24, 2010
INVENTOR(S) : Savariar-Hauck et al.

It is certified that error appears in the above-identified patent and that said Letters Patent is hereby corrected as shown below:

In Column 34, line 56, Claim 7, before "10" insert -- (A) --.
In Column 34, line 57, Claim 7, before "0.1" insert -- (B) --.
In Column 34, line 58, Claim 7, before "20" insert -- (C) --.

Signed and Sealed this
Nineteenth Day of March, 2013

Teresa Stanek Rea
*Acting Director of the United States Patent and Trademark Office*